United States Patent [19]
Marty et al.

[11] Patent Number: 6,031,445
[45] Date of Patent: Feb. 29, 2000

[54] TRANSFORMER FOR INTEGRATED CIRCUITS

[75] Inventors: Michel Marty, Saint Paul de Varces; Hervé Jaouen, Meylan, both of France

[73] Assignee: STMicroelectronics S.A., Gentilly, France

[21] Appl. No.: 09/199,837

[22] Filed: Nov. 25, 1998

[30]   Foreign Application Priority Data

Nov. 28, 1997  [FR]  France ................................. 97 15333

[51] Int. Cl.$^7$ ........................................................ H01F 5/00
[52] U.S. Cl. ........................ 336/200; 336/223; 336/232; 29/602.1
[58] Field of Search .................................... 336/200, 232, 336/223, 225; 29/602.1; 257/531

[56]   References Cited

U.S. PATENT DOCUMENTS

| | | | |
|---|---|---|---|
| 4,729,510 | 3/1988 | Landis | 333/162 |
| 5,372,967 | 12/1994 | Sundaram et al. | 437/60 |
| 5,446,311 | 8/1995 | Ewen et al. | 257/531 |
| 5,612,660 | 3/1997 | Takimoto | 336/200 |

FOREIGN PATENT DOCUMENTS

| | | |
|---|---|---|
| 0413348A2 | 2/1991 | European Pat. Off. . |
| 3315 549 | 10/1984 | Germany . |
| 60-136363 | 7/1985 | Japan . |

*Primary Examiner*—Lincoln Donovan
*Assistant Examiner*—TuYen T. Nguyen
*Attorney, Agent, or Firm*—Theodore E. Galanthay; David V. Carlson; Seed and Berry LLP

[57]   ABSTRACT

A invention provides a transformer for use in integrated circuits, comprising four layers of conductive lines, separated from each other by first, second and third insulating layers. First conductive vias traverse the second insulating layer to connect said second and third pluralities of conducting lines, to form a first winding. Second conductive vias traverse the first, second and third insulating layers to connect said first and fourth pluralities of conducting lines to form a second winding, about and approximately concentric with said first winding.

18 Claims, 10 Drawing Sheets

United States Patent 6,031,445

TRANSFORMER FOR INTEGRATED CIRCUITS

TECHNICAL FIELD

The invention relates to the manufacture of inductors in integrated circuits. More particularly, it relates to the manufacture of high quality transformers in monolithic integrated circuits.

BACKGROUND OF THE INVENTION

Many structures have been proposed for the manufacture of inductors or transformers in integrated circuits. Many structures comprise a planar, spiral arrangement of conductive track, arranged in a plane parallel to the semiconductor substrate. By adding several of these in magnetic communication, a transformer is formed.

FIG. 1 shows such a transformer, composed of multiple planar spiral inductors, as described by Burghartz et al. in IEEE Transactions on Electron Devices, vol. 43, No 9, September 1996. Upon a substrate 6, a spiral inductor is formed in each of several conductive layers 10, 12, 14, 16, respectively separated by insulating layers 18, 20, 22. Electrical contact is provided to each end 24, 26 of each spiral inductor. Due to magnetic coupling between the spirals, an alternating signal applied to one spiral will be detectable on some or all of the other spirals, thus performing a transformer function.

Such a transformer has at least three major drawbacks. Firstly, the electromagnetic coupling between spiral layers is poor, since the distances between consecutive spirals 10, 12 is defined by the thickness of an interlevel dielectric layer 18. These interlevel dielectric layers tend to be designed to be thick enough to avoid parasitic capacitance between conductors of consecutive conductive layers, elsewhere in the integrated circuit. They may typically have a thickness of 1 μm.

There will therefore be a low coupling coefficient between the spirals 10, 12 and the factor of merit of the resulting transformer, defined as the ratio of the current-voltage product of an input signal on a primary winding to the current-voltage product of an output signal from a secondary winding, is low.

Secondly, the electromagnetic field generated by the spiral inductors is substantially vertical; perpendicular to the surface of the substrate 6. During operation, a substantial amount of electromagnetic field will penetrate into the substrate 6. This is disadvantageous because a voltage is thereby induced in the substrate. Such voltage may cause leakage currents; may turn on some components within the integrated circuit; and may modify the operating characteristics of components of the integrated circuit, so that the integrated circuit is rendered inoperative.

Alternatively, a ground plane could be placed on the lowest conductive layer 10. This would, however, increase the parasitic capacitance associated with the structure, reducing the factor of merit of the resulting transformer. The introduction of a conductive plate may also have undesirable antenna effects.

Thirdly, the illustrated transformer occupies a large surface area of the substrate 6. The cited document discloses an area of 226 μm×226 μm for a spiral inductor of 3–6 turns, and an inductance of 1.4–11 nH.

FIG. 2 shows another prior art transformer for integrated circuits, as published in European Patent Application EP-A-0 725 407. Using two conductive layers 10, 12, and a series of vias 30, two concentric, intertwined windings A–A', B–B'are provided, wound around a ferromagnetic core 31. This transformer provides an increased coupling between the primary winding A–A' and the secondary winding B–B'. The substrate surface area occupied by this structure is still relatively large. The surface area will be defined by the necessary size of the ferromagnetic core, the required spacing between that and the vias 30 of the windings and the size of the vias, in the width direction, and the spacing between adjacent metal tracks and the required number of turns, in the length direction. For each turn of the primary and secondary windings, two windings are made around the core 31, meaning that the resulting transformer is twice as long as would be a simple inductor with the same number of turns as one winding of the transformer.

The use of ferromagnetic materials, such as required to fabricate the core 31 is not well controlled in current integrated circuit manufacturing techniques. Furthermore, the coupling between the windings is not very high, although improved with respect to the structure of FIG. 1.

SUMMARY OF THE INVENTION

An object of the invention is to provide a transformer structure for use in an integrated circuit, where the coupling between primary and secondary windings is high.

An object of the invention is to provide such a transformer structure which reduces the transmission of electromagnetic field into the substrate.

An object of the invention is to provide such a transformer structure which occupies a reduced surface area of the substrate.

An object of the invention is to provide such a transformer structure which is compatible with current manufacturing methods, and requires no special process steps, or special materials.

Accordingly, the invention provides a transformer for use within an integrated circuit comprising a substrate with a horizontal upper surface. The transformer comprises a first plurality of conductive lines arranged in a first layer on the upper surface of the substrate; a second plurality of conductive lines arranged in a second layer, vertically separated from the first plurality of conductive lines by a first insulating layer; a third plurality of conductive lines arranged in a third layer, vertically separated from the second plurality of conductive lines by a second insulating layer; a fourth plurality of conductive lines arranged in a fourth layer, vertically separated from the third plurality of conductive lines by a third insulating layer; first conductive vias extending through second insulating layer, connecting said second and third pluralities of conducting lines, whereby said second and third pluralities of conducting lines and said first conductive vias form a first winding; and second conductive vias extending through first, second and third insulating layers, connecting said first and fourth pluralities of conducting lines, whereby said first and fourth pluralities of conducting lines and said second conductive vias form a second winding, about and approximately concentric with said first winding.

According to an embodiment of the present invention, the axes of said first and second windings are substantially parallel to the upper surface of the substrate.

According to an embodiment of the present invention, each of the fourth plurality of conductive lines is unitarily composed with at least part of underlying second conductive vias.

According to an embodiment of the present invention, each of the third plurality of conductive lines is unitarily composed with underlying first conductive vias, such units being in direct electrical contact with underlying respective ones of the second plurality of conductive lines.

According to an embodiment of the present invention, the second conductive vias comprise pads in second and third layers, each pad being unitarily composed with an underlying part of respective second conductive vias.

According to an embodiment of the present invention, each of the fourth plurality of conductive lines is unitarily composed with underlying second conductive vias, such units being in direct electrical contact with underlying respective ones of the first plurality of conductive lines.

According to an embodiment of the present invention, the conductive lines and the conductive vias are substantially composed of copper.

According to an embodiment of the present invention, the conductive lines and the conductive vias are substantially composed of aluminum.

According to an embodiment of the present invention, the conductive lines and the conductive vias further comprise a coating layer of titanium nitride, encapsulating the conductive lines and the conductive vias on all surfaces other than their upper surfaces.

According to an embodiment of the present invention, each turn of each winding includes only two contact surfaces.

The present invention also provides a method for forming transformers in integrated circuits, comprising the steps of: (a) forming a first dielectric layer on an upper surface of a substrate; (b) patterning the first dielectric layer with a motif to form cavities corresponding to a desired arrangement of first conductive lines; (c) filling the cavities in the first dielectric layer to form a first plurality of conductive lines arranged in a first layer; (d) depositing a first insulating layer; (e) forming a second dielectric layer on the upper surface of the resulting structure; (f) patterning the second dielectric layer with a motif to form cavities corresponding to a desired arrangement of second conductive lines; (g) filling the cavities in the second dielectric layer to form a second plurality of conductive lines arranged in a second layer; (h) depositing a second insulating layer; (i) forming a third dielectric layer on the upper surface of the resulting structure; (j) patterning the third dielectric layer with a motif to form cavities corresponding to a desired arrangement of third conductive lines; (k) filling the cavities in the third dielectric layer to form a third plurality of conductive lines arranged in a third layer; (l) depositing a third insulating layer; (m) forming a fourth plurality of conductive lines arranged in a fourth layer; (n) between steps (h) and (l), performing the steps of: (n1) forming cavities in the second insulating layer according to a motif corresponding to required locations of first conductive vias; (n2)—filling the cavities in the second insulating layer with conductive material to form first conductive vias extending through second insulating layer, to electrically connect respective ones of second and third pluralities of conducting lines, to form a first winding; and (p) between steps (d) and (m), performing the steps of: (p1) forming cavities in the first, second and third insulating layers according to a motif corresponding to required locations of second conductive vias; (p2) filling the cavities in the first, second, and third insulating layers with conductive material to form first conductive vias extending through first, second and third second insulating layers, to electrically connect respective ones of first and fourth pluralities of conducting lines, so as to form a second winding about and approximately concentric with said first winding According to an embodiment of the present invention the step (m) comprises the steps of: (m1) forming a fourth dielectric layer on an upper surface of a substrate; (m2) patterning the fourth dielectric layer with a motif to form cavities corresponding to a desired arrangement of fourth conductive lines; (m3)—filling the cavities in the fourth dielectric layer to form the fourth plurality of conductive lines.

According to an embodiment of the present invention, in step (p1), the cavities are formed in first, second and third insulating layers in a single step.

According to an embodiment of the present invention, in step (p2), the filling of the cavities in first, second and third insulating layers is performed in a single step.

According to an embodiment of the present invention, in step (p2), the filling of the cavities in first, second and third insulating layers is performed within step (m3).

According to an embodiment of the present invention, in step (p1), the cavities are formed in second and third insulating layers in a single step.

According to an embodiment of the present invention, the filling of the cavities in second and third insulating layers is performed in a single step.

According to an embodiment of the present invention, in step (p2), the filling of the holes in second and third insulating layers is performed within step (m3).

BRIEF DESCRIPTION OF THE DRAWINGS

A certain embodiment of the current invention will be described, by way of example, with reference to the accompanying diagrams, wherein.

DETAILED DESCRIPTION OF THE INVENTION

Figure 3:
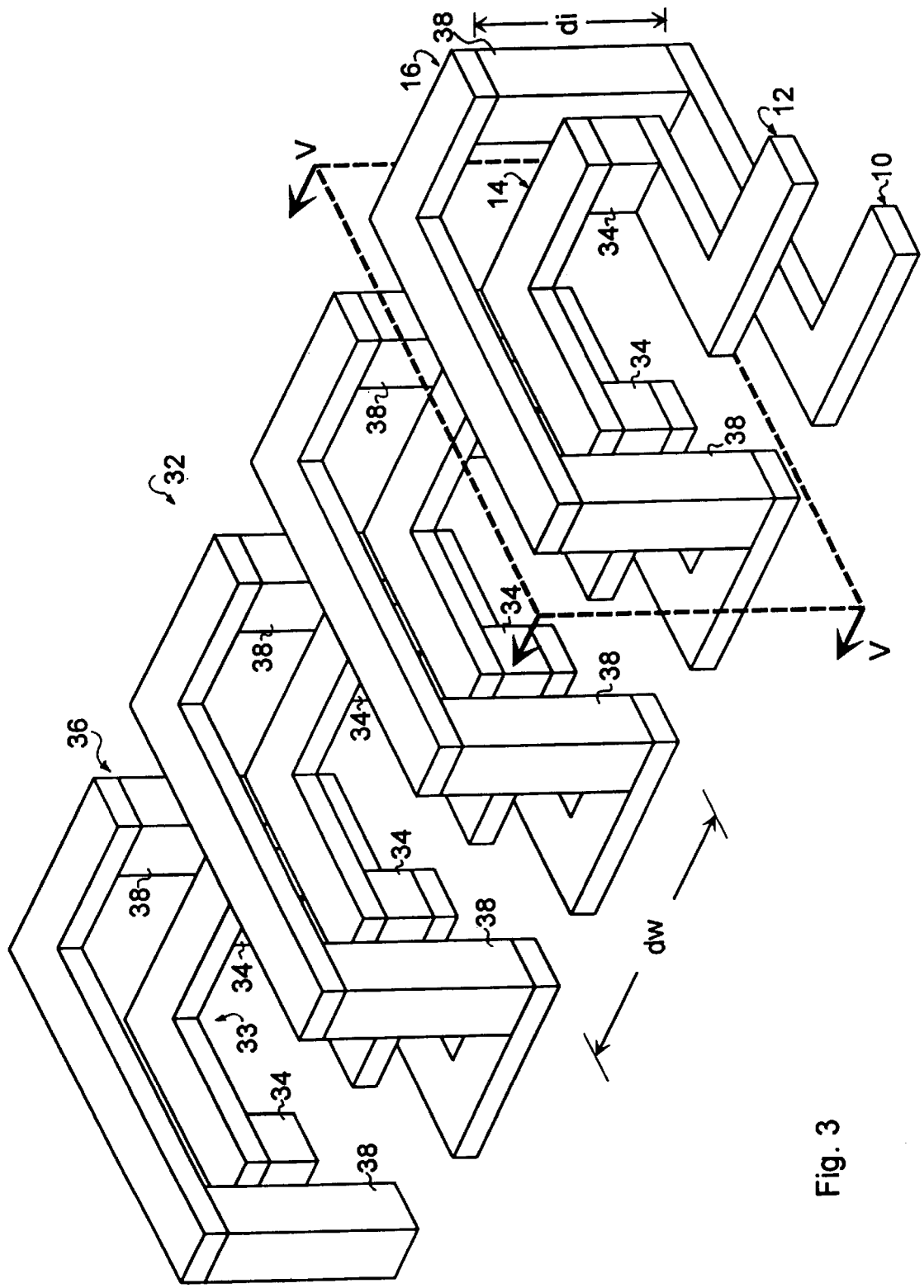
FIG. 3 shows a perspective view of a transformer for integrated circuits, according to the present invention.

FIG. 3 shows a transformer 32 for integrated circuits, according to the invention. For clarity, the substrate 6 and various layers are omitted from the diagram. Four layers 10, 12, 14, 16 of conductive lines are used.

Primary winding 33 is formed from conductive lines of second 12 and third 14 layers, and first vias 34. Second and third conductive layers are patterned to form conductive lines, for example in L shapes, which are connected together by first vias 34 to form winding 33, whose axis is substantially parallel to the substrate upon which the entire transformer structure is formed.

A secondary winding 36 is formed from first 10 and fourth 16 conductive layers, and second vias 38. First and fourth conductive layers are patterned, for example into L shapes, and connected together by second vias 38 to form secondary winding 36, about and substantially concentric with the primary winding 33, and having an axis substantially parallel to the upper surface of the substrate upon which the entire transformer structure 32 is formed.

Figure 1:
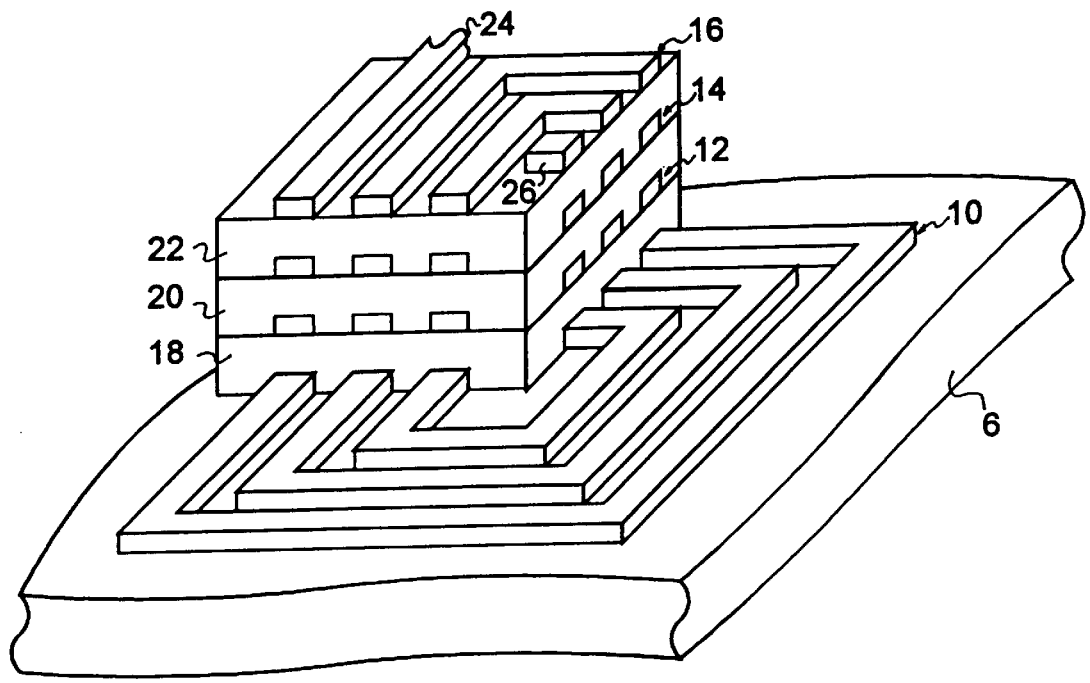
FIG. 1 shows a transformer for integrated circuits according to the prior art.
Figure 2:
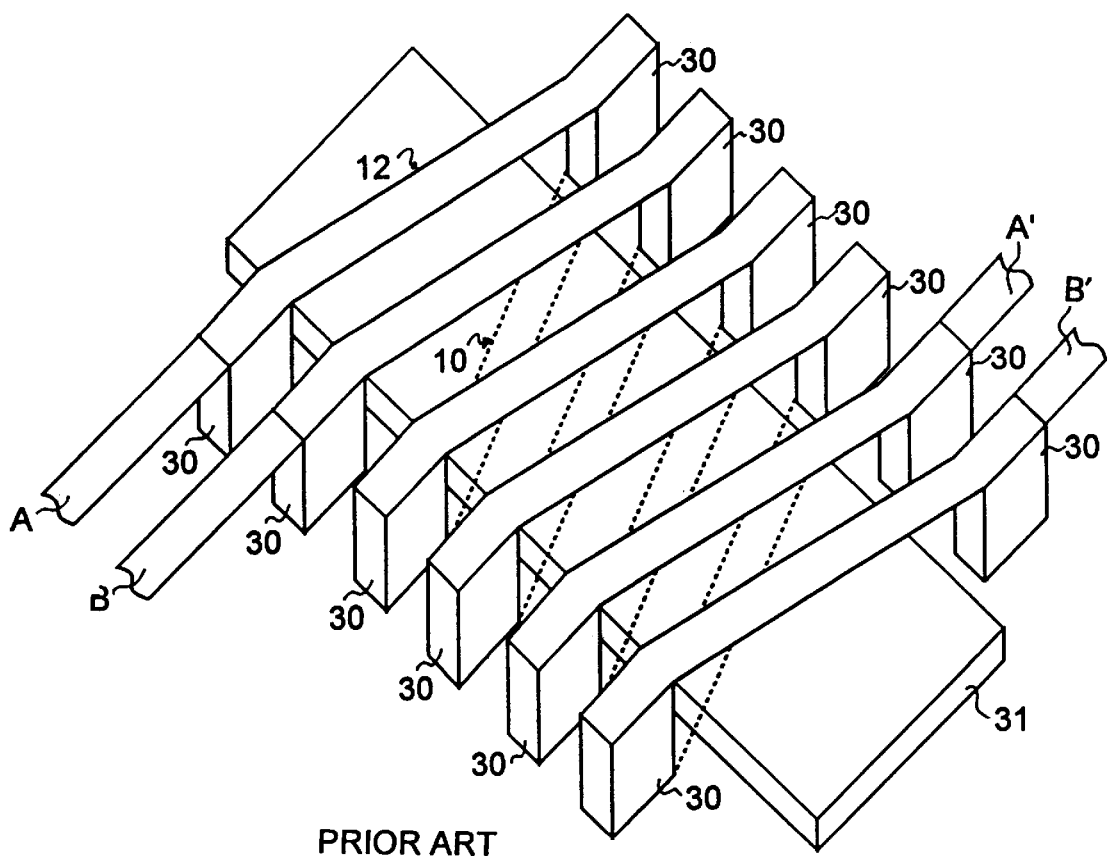
FIG. 2 shows a further transformer for integrated circuits according to the prior art.

The pitch dw between adjacent windings has been exaggerated for clarity. In two pitch lengths dw, two complete turns of both primary 33 and secondary 36 winding are completed. In a corresponding length of the structure of FIG. 2, only one turn of each of the primary A–A' and secondary B—B' windings is completed.

In the example shown in FIG. 3, primary 33 and secondary 36 windings have an equal number of turns. The transformer 32 will therefore act as an isolating transformer, neither multiplying nor dividing a voltage applied to the primary winding 33. By modifying the turns ratio of the windings 33, 36, step-up and step-down transformers could be provided.

Adjacent turns of each of primary 33 and secondary 36 windings may be packed as closely together as allowed by the design rules of the manufacturing process used. It is advantageous for the turns of each winding to be packed as closely together as possible, to ensure maximum coupling between primary 33 and secondary 36 windings. By packing the turns as closely as possible, the surface area of the substrate occupied by the transformer structure 32 may be minimized. However, packing of the turns of each winding too close together will cause an unacceptably large parasitic capacitance between adjacent turns of a same winding. The horizontal spacing between turns in each winding may be freely selected, provided that a minimum spacing is provided, as defined in the respective design rules. A pitch, dw, is therefore selected that will have low capacitive coupling but will also be sufficiently compact and provide the desired inductance for the circuit design. In one embodiment, in order to minimize undesirable capacitive coupling between adjacent turns of a same winding, a pitch dw of 4.5 μm or more is desirable.

Vertical spacing di between layers of conductive lines is determined by the thicknesses of the dielectric layers used in that particular manufacturing process employed. A current typical thickness for an insulating layer lying between layers of conductive lines is approximately 1 μm. The vertical separation between the first layer 10 and the fourth layer 16 will be equivalent to the sum of the total thickness of the three dielectric layers lying between respective conductive layers, the thickness of the second and third conductive layers, and the thickness of any masking layers included. This gives a total vertical spacing di typically at least 3–4 μm, which is sufficient to reduce the capacitive coupling between the various layers to an acceptable level. In some embodiments, the various layers will be thinner, or maybe thicker, depending on the manufacturing process and layers employed.

Using the transformer structure illustrated in FIG. 3, a high coupling factor between the windings is assured, as the primary winding 33 is surrounded by secondary winding 36. The transformer 32 will therefore have a high factor of merit.

The electromagnetic field generated by the primary winding, 33 is substantially parallel to the substrate, so that very little of the electromagnetic field will enter the substrate. Furthermore, the coupling factor with the secondary winding is so great that very little of the electromagnetic field will escape from the secondary winding. No ground shield is required with the transformer structure of the invention.

Having thus disclosed the basis of the invention, below are described several alternative practical embodiments of the structure of FIG. 3. All figures used to illustrate these embodiments are cross sections taken in the plane V, looking in the direction shown by arrows, in FIG. 3.

Figure 4A:
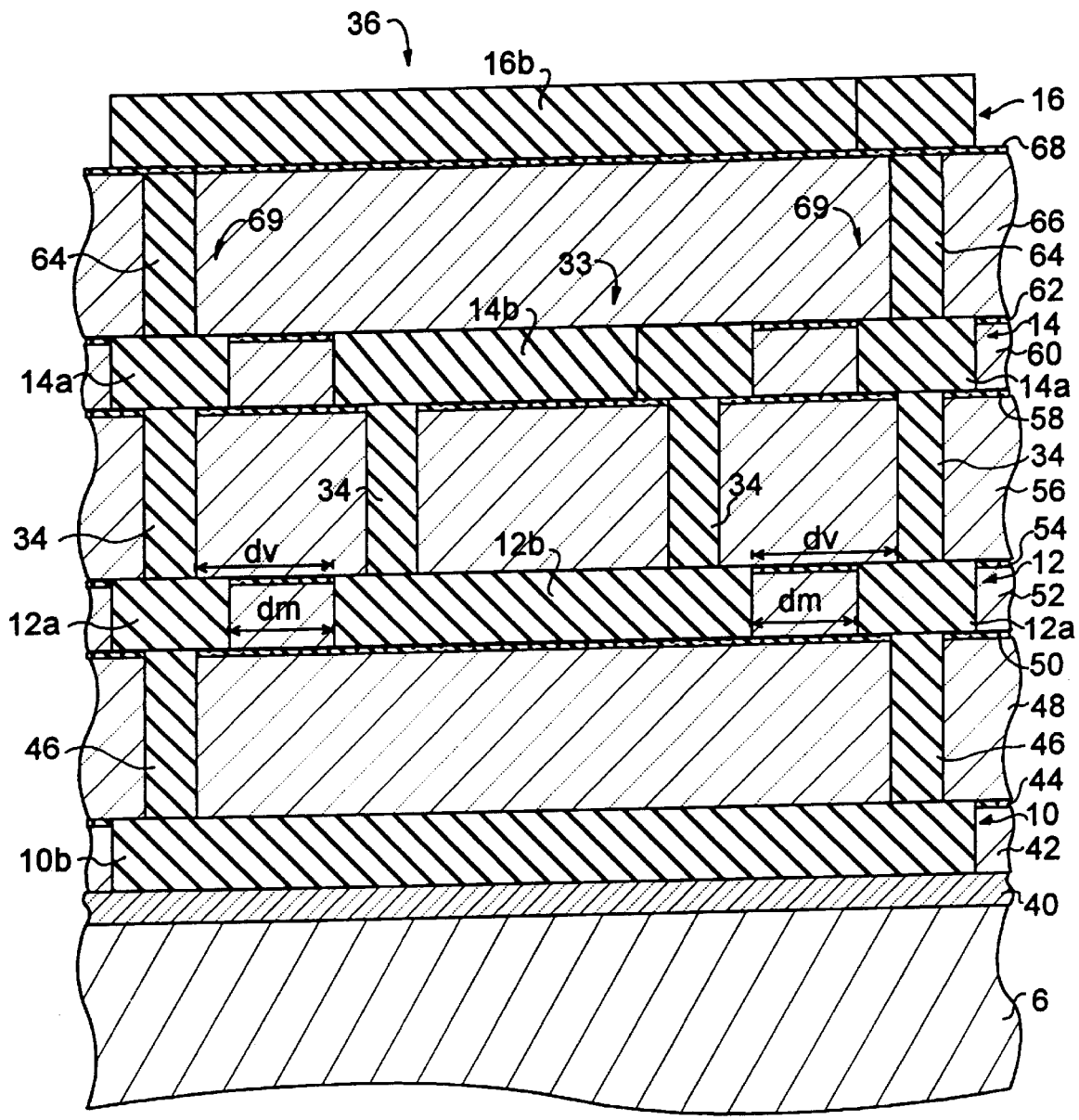
FIGS. 4A–7B show cross-sections of embodiments of a transformer for integrated circuits, according to the present invention.

FIG. 4A shows one embodiment of the integrated transformer structure of the invention, using a single damascene pattern formation method for both conductive layers and vias. Substrate 6 may be covered with an insulating layer 40, such as a field oxide layer. A first dielectric layer 42 is then formed over field oxide layer 10, then a first masking layer 44 is formed, and patterned with the motif required for the first layer 10 of conductive lines. The first dielectric layer 42 is patterned, such as by using a selective, anisotropic etch through the first masking layer 44. A suitable etch is a plasma etch, using a fluorocarbon compound such as $C_4F_8$ for a silicon nitride mask layer 44 on a silicon dioxide based dielectric layer 42. The selectivity of such etch chemistries increases with the proportion of carbon present, so $C_4F_8$ is more selective than $CF_4$. Cavities so formed are filled with conductive material to form the conductive lines of first layer 10. This may either be by selective deposition, or by depositing the material of first conductive layer 10 over the entire remaining surface of first masking layer 44 and within the cavities, then removing the material overlying the masking layer, by a polishing step or by a wet or dry etching step. This is standard single damascene processing, well known in itself to those skilled in the art.

Further dielectric and masking layers are deposited, and similar process steps are used to form:

vias 46 in a first insulating layer 48 under a second masking layer 50;

second layer 12 of conductive lines 12a, 12b in a second dielectric layer 52 under a third masking layer 54;

vias 34 in a second insulating layer 56 under a fourth masking layer 58;

third layer 14 of conductive lines 14a, 14b in a third dielectric layer 60 under a fifth masking layer 62;

vias 64 in a third insulating layer 66 under a sixth masking layer 68.

Each layer 12, 14 contains conductive pads 12a, 14a, covering locations chosen for the formation of vias 34, 64 in the following insulating layer. These pads typically have a width and length 2–3 times the diameter of the vias. They must be separated from adjacent conductive lines 12b, 14b of primary winding 33 by at least the minimum spacing dm allowed in the manufacturing process used.

The fourth layer 16 of conductive lines 16b may be formed in a similar way, using the above-described single damascene process, or may be deposited and patterned by any other method, as convenient to the manufacturing process of the integrated circuit of which the transformer of the invention forms a part.

As each stack of vias and conductive pads 46, 12a, 34, 14a, 64 serves only to connect one conductive line 16b to another conductive line 10b, each stack could be considered to be a single via 69, traversing first, second and third insulating layers, second and third dielectric layers and the masking layers.

Each of the layers 10, 12, 14, 16 of conductive lines and first, second and third dielectric layers 42, 52, 62 may be 0.5 μm thick, Each of the first, second and third dielectric layers 48, 56, 66 (including vias 46, 34, 64) may be 1 μm thick. The mask layers may be 0.1 μm thick. The mask layers may be composed of silicon nitride. The dielectric layers may be composed of silicon dioxide, or a silicon dioxide based glass material, such as BPSG, PSG, TEOS. The conductive lines of layers 10, 12, 14, 16 may be composed of tungsten, copper or aluminum, or other conductive materials, but should preferably be composed of a material of low resistivity.

In order to make viable transformers, the resistance of each winding must be kept to a minimum. This resistance includes the series resistance of the conductive lines 10b, 12b, 14b, 16b used, and the resistance of the vias 34, 69 connecting those lines together.

In high frequency applications, the number of turns required in each winding may be high. Using the standard single damascene via formation process described above, the following results may be achieved: for vias 64, 34, 46 of 0.5 μm diameter, via resistance varies between 0.2–0.5 Ω. When a barrier or coating layer is used—for example, a layer of titanium nitride TiN under tungsten—the via resistance is increased by the resistance of that layer. A CVD deposited layer of TiN has a resistivity of about 70 μΩ.cm. For a typical via, with a cross-section of 0.4 μm×0.4 μm, the resistance of each via is increased by about 0.1 Ω by the inclusion of a 5 nm thick layer of TiN.

It has been observed that for optimum performance of the transformer via resistances no greater than 0.2 Ω per via layer 46, 34, 64 is preferred.

Figure 4B:
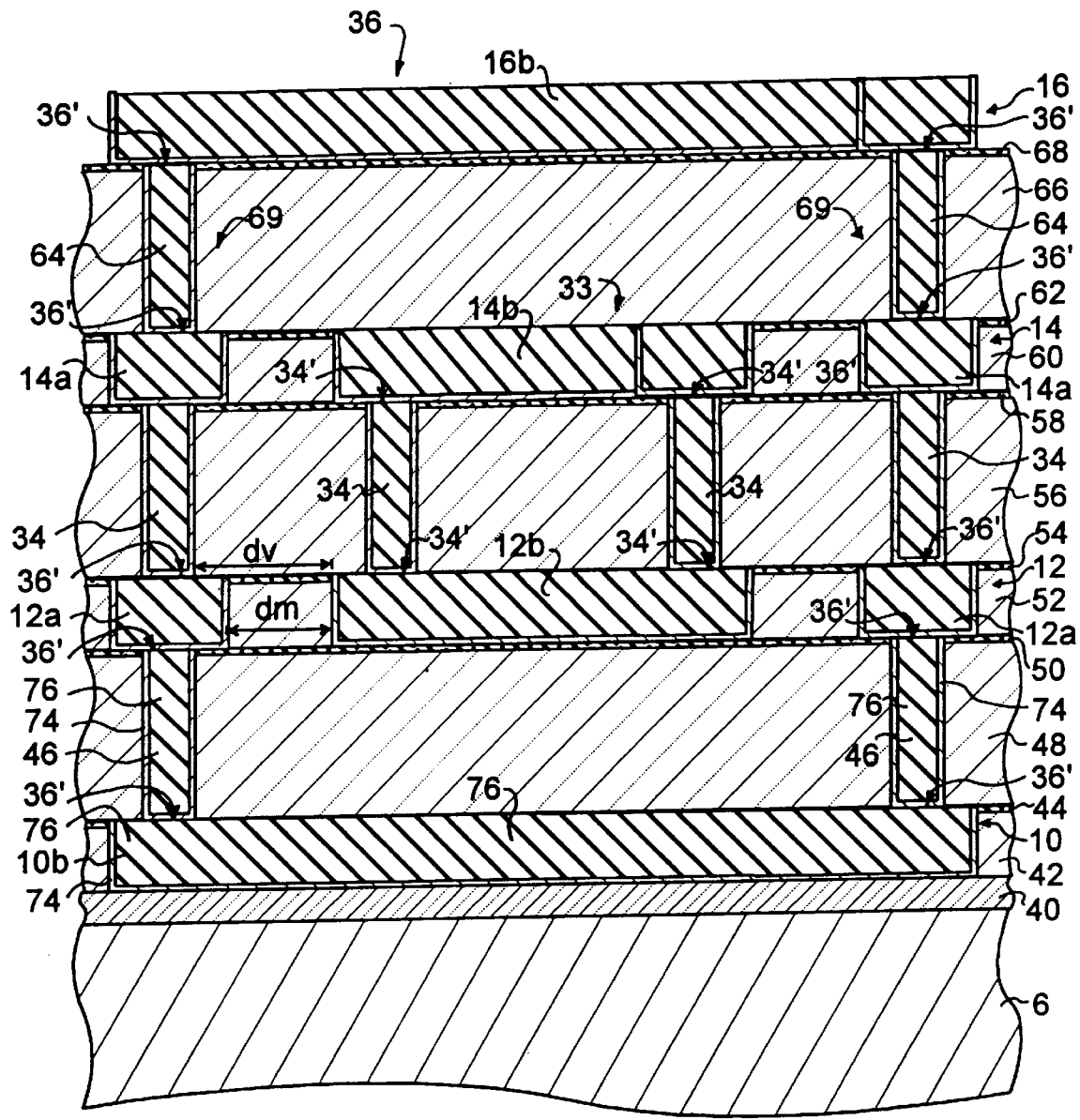

FIG. 4B shows a variant of the embodiment of FIG. 4A. Each conductive layer 10, 12, 14, 16 is formed substantially as described above, except that a coating layer 74 is deposited inside each cavity, before a highly conductive material 76 is deposited. Subsequently, polishing or etch steps are performed to remove highly conductive material 76 and coating layer 74 from places other than inside the cavities. Each conductive line and each via is encapsulated by the coating layer 74 on all surfaces except the respective upper surfaces.

Similarly, for the formation of vias 46, 34, 64, coating layer 74 is first deposited inside the cavities, before a highly conductive material 76 is deposited to fill the vias.

Examples of suitable materials for the coating layer 74 and the highly conductive material 76 are:

1) a 20 nm titanium layer below aluminum 76. In this case, an intermetallic compound TiAl₃ is formed, about 60 nm thick, with a resistivity of some 70 μΩ.cm. Aluminum has a resistivity of about 3 μΩ.cm.

2) a titanium nitride (TiN) layer under tungsten (W). The resistivity of W is about 12 μΩ.cm.

3) a 10 nm TiN layer below copper, which has a resistivity of only about 1.8 μΩ.cm. This is the preferred selection of materials.

It is important to reduce the via resistance as far as possible since each turn of each winding includes several via layers 46, 34, 64. Any increase in via resistance will significantly increase the overall series resistance of the transformer, reducing its factor of merit.

Although the resistivity of the vias largely determines the series resistance of each winding, the resistance of the conductive lines may become important for a very long transformer structure.

It would therefore be advantageous to reduce the number of contact surfaces 34', 36' to a minimum, in particular the number of coating layers 74 to be traversed by a current flowing in the windings of the transformer.

As can be seen in FIG. 4B, each turn of the primary winding 33 includes four contact surfaces 34', and each turn of the secondary winding 36 includes twelve contact surfaces 36'.

Figure 5A:
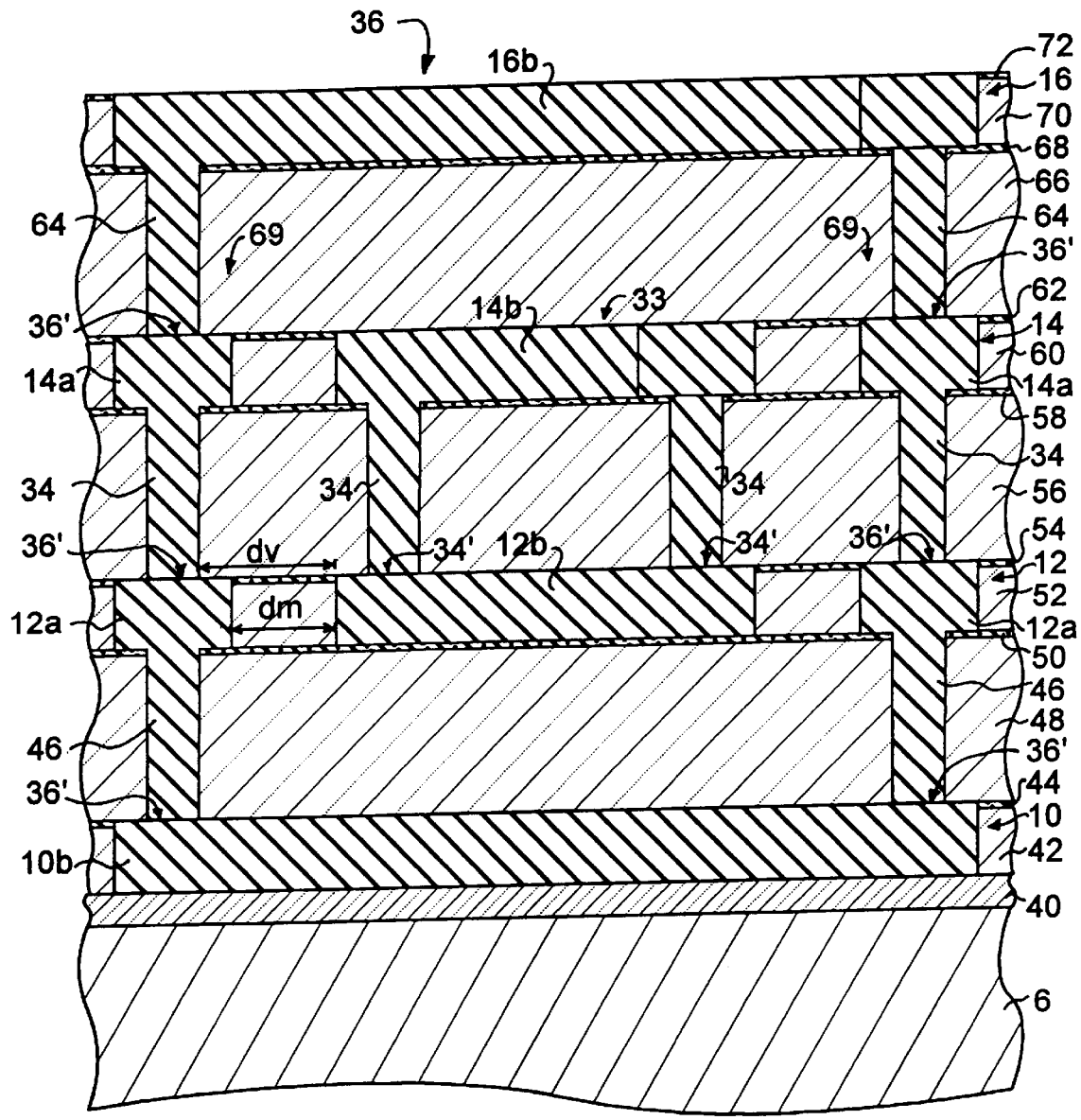

FIG. 5A shows a second embodiment of the transformer structure according to the invention. According to this embodiment of the invention, a so called "dual-damascene" process is used. The first conductive layer 10 is formed as described with reference to FIG. 4A. Next, first insulating layer 48 and second masking layer 50 are formed. Second mask layer 50 is patterned, but first insulating layer 48 is not etched at this stage. Second dielectric layer 52 and third masking layer 54 are formed. Third masking layer 54 is patterned. In a single etch step, second dielectric layer 52 is etched through third masking layer 54, and first insulating layer 48 is etched through second mask layer 50. Resulting cavities define the location of vias 46 and conductive lines of second layer 12. Both are filled at the same time by a deposition of conductive material. This may be a CVD deposition, a metal deposition by heated pulverization or any other suitable process. Excess conductive material is then removed from the surface of masking layer 54, as described with reference to FIG. 4A. Conductive pads 12a and underlying vias 46 are unitarily composed of a single conductive material. Each such unit is in direct electrical contact with a corresponding underlying conductive line 10b of first layer 10.

A similar process is used to define:

vias 34 and third conductive layer 14 through second insulating layer 26 and third dielectric layer 60, using fourth and fifth mask layers 58, 62; and vias 64 and fourth conductive layer 16 through third insulating layer 66 and a fourth dielectric layer 70, using sixth and seventh mask layers 68, 72. Each via and pad 12a unit so formed has a series resistance of typically 0.2 Ω.

In the above described embodiments, dielectric and insulating layers 42, 48, 52, 56, 60, 66, 70 may be composed of silicon dioxide, or a silicon dioxide bases glass material, such as TEOS, PSG, BPSG. Mask layers 44, 50, 54, 58, 62, 68, 72 may be composed of silicon nitride, or any material which is electrically insulating, and selectively etchable with respect to the materials of the dielectric, insulating and conductive layers. The conductive layers 10, 12, 14, 16 may be composed of any metallic material of low resistivity, such as aluminum, copper, or tungsten.

Field oxide layer 40 may be composed of silicon dioxide, and substrate 6 may be composed of silicon.

As can be seen from FIG. 5A, in this embodiment the primary winding 33 only has two contact surfaces 34' per turn and secondary winding 36 only has six contact surfaces 34' per turn. Accordingly, the embodiment of FIG. 5A has only half the number of contact surfaces compared to the embodiment of FIG. 4A. The resistance of each turn of each winding is accordingly reduced by half the contribution of the contact resistances. The factor of merit of the resulting transformer structure is accordingly improved.

Figure 5B:
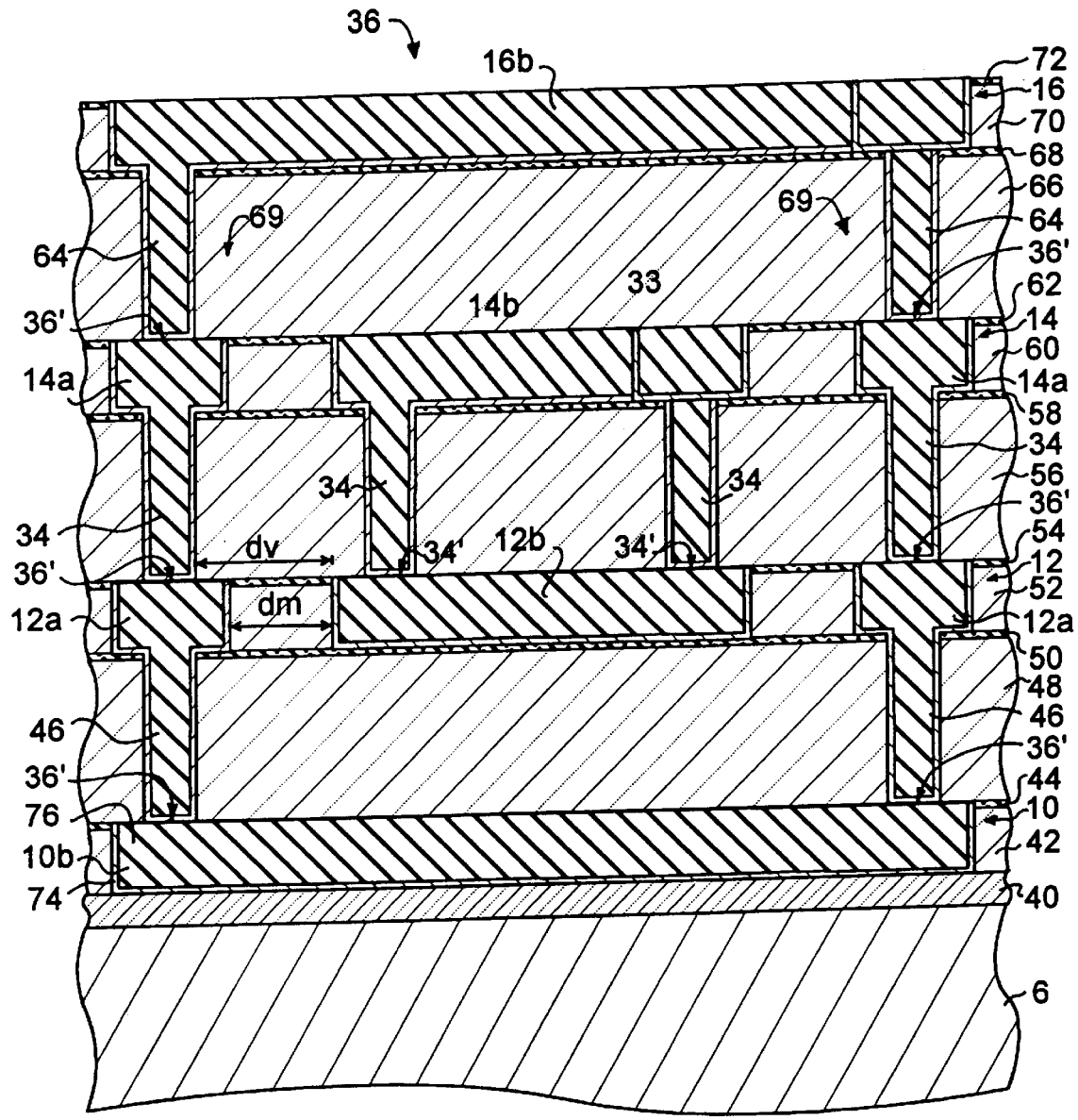

Figure 5B represents a variant of the embodiment shown in FIG. 5A, similar to the variant shown in FIG. 4B of the embodiment shown in FIG. 4A. After etching through first dielectric layer 42 to form cavities in the required motif of first conductive layer 10, thin coating layer 74 is deposited inside the cavities. Following this deposition, highly conductive material 76 is deposited, to cover the coating layer 74 and to fill the cavities. Portions of coating layer 74 and conductive material 76 remaining on the mask layer 44 other than within the cavities are removed by polishing or wet or dry etching. Later in the manufacturing process, when first insulating layer 48 and second dielectric layer 52 are etched through second and third mask layers 50, 54, the sequence of depositing coating layer 74, depositing conductive material 76 and removing the coating and further conductive layers other than in the etched cavities is repeated.

The sequence of etching cavities through two dielectric layers, using two mask layers, depositing coating layer 74, depositing further conductive layer 76 and removing the coating and Further conductive layers other than in etched cavities is also repeated for:

defining vias 34 and third conductive layer 14 in second insulating layer 56 and third dielectric layer 60, through mask layers 58, 62; and defining vias 64 and fourth conductive layer 16 in third insulating layer 66 and fourth dielectric layer 70, through mask layers 68, 72.

Using the preferred materials, a 10 nm layer 74 of TiN and copper conductive material 76, a majority of the resistance of each winding is contained in the contact resistances of each contact surface. This is largely due to TiN having a much higher resistivity than copper. In the embodiment of FIG. 6, only six contact resistances are included per turn of secondary winding 36, and only four contact resistances are included per turn of primary winding 33. This substantially reduces the resistance of each winding, and improves the factor of merit of the resulting transformer structure.

Figure 6A:
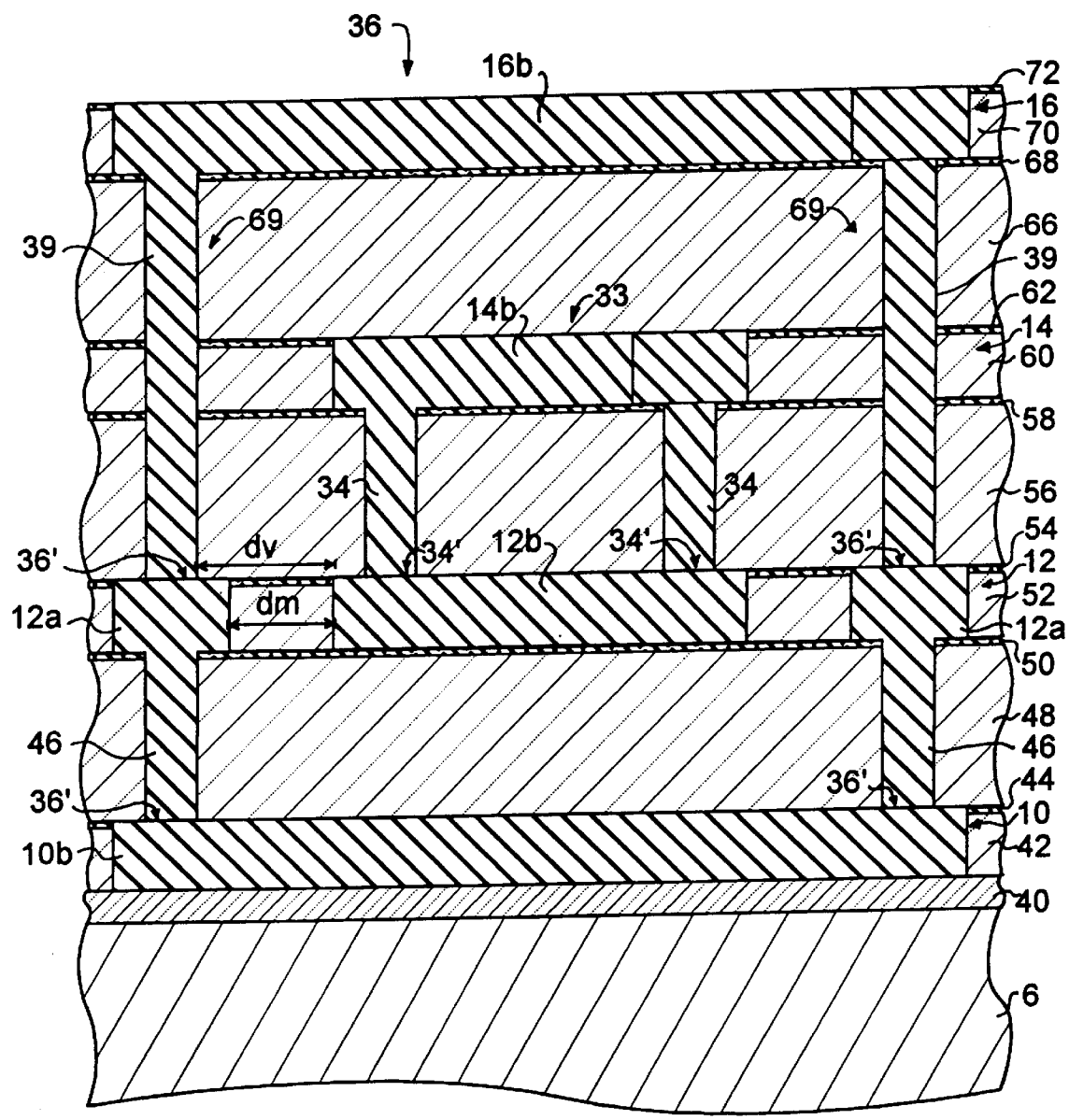

FIG. 6A shows a further embodiment of the invention. First conductive layer 10 is formed within the first dielectric layer 42 by any suitable process, such as the single damascene process described above. Vias 46 and second conductive layer are unitarily formed within layers 48, 52, using mask layers 50, 54, with the dual damascene process as described in relation to FIG. 5A. Layers 56, 60 are then deposited, along with fourth and fifth mask layers 58, 62. Vias 34 and conductive layer 14 parts of the primary winding 33 are respectively formed in the second insulating layer 56 and the third dielectric layer 60. Vias are not, however, formed at this stage for the secondary winding 36.

Layer 66 is deposited. Sixth masking layer 68 is deposited, and is patterned with a motif representing the required locations of vias 39.

Layer 70 is deposited, followed by seventh mask layer 72. Seventh mask layer 72 is then patterned with a motif representing the required layout of fourth conductive layer 16. A single anisotropic etch, selective to the material of the dielectric and insulating layers, is applied to the structure. Cavities are cut in the fourth dielectric layer 70 to correspond to the required pattern of fourth conductive layer 16. Via cavities are cut in the required locations of vias 39. This etch continues for long enough to cut the via cavities through layers 66, 60, 56 and fifth and fourth mask layers 62, 58. The sixth and seventh mask layers 68, 72 must either be of a different material, selectively etchable, with respect to the other mask layers 58, 62, or must be thicker than the other mask layers 58, 62 if composed of the same material. Either several different etch steps must be used to alternatively etch dielectric layer material, insulating layer material and mask layer material, or a single etch chemistry must be used that it capable of anisotropically etching all these materials.

A conductive material is then deposited into the via and conductive line cavities, to unitarily form vias 39 and conductive lines 16b. This may be achieved by CVD, or a metal deposition by heated pulverization, or any other suitable process.

Figure 6B:
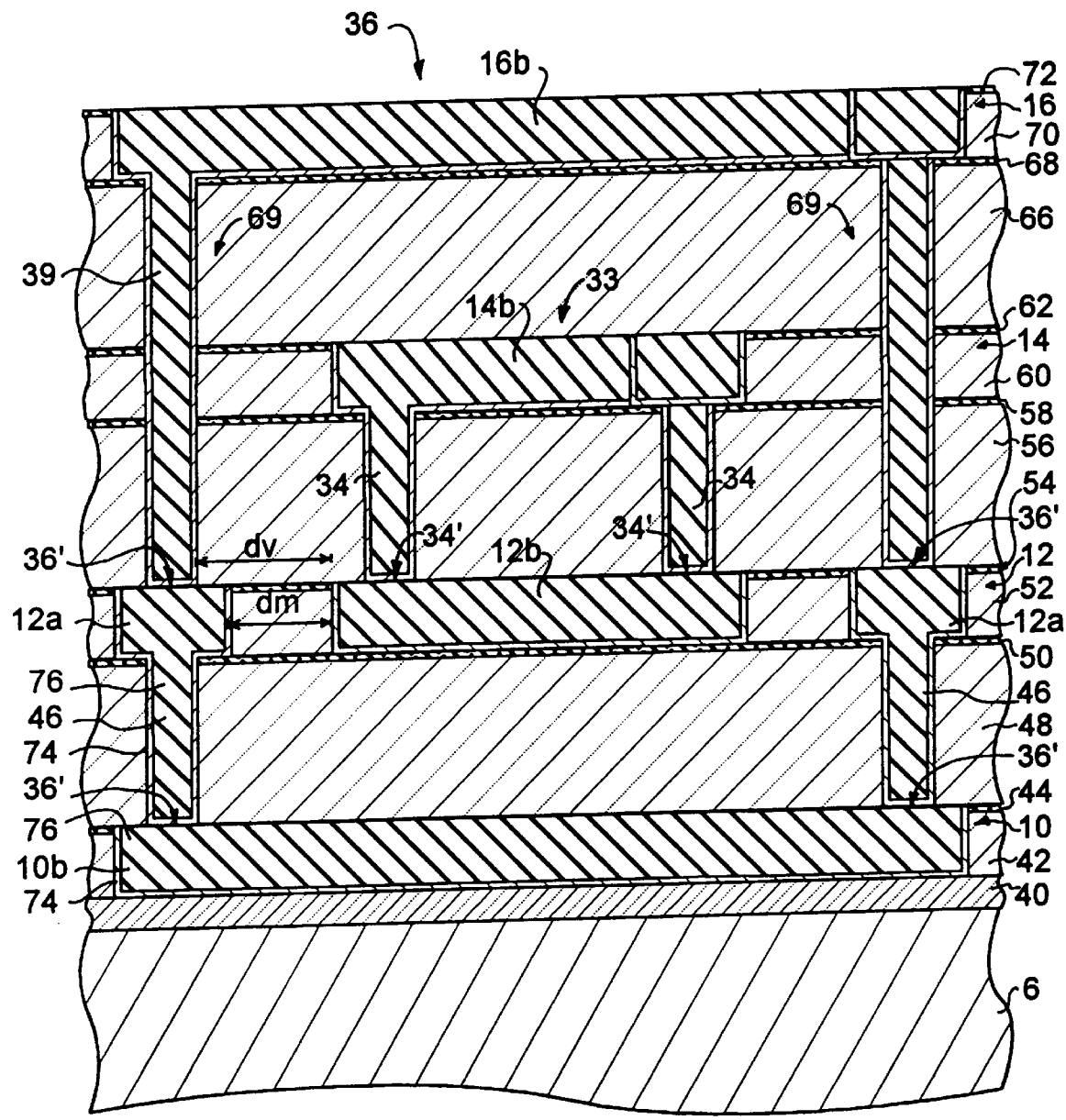

FIG. 6B shows a further embodiment of the invention, a variant of the embodiment shown in FIG. 6A. After etching through first dielectric layer 42 in the required motif for first conductive layer 10, a thin coating layer 74 is deposited inside the cavity. Following this deposition, a highly conductive material 76 is deposited, to cover the coating layer 74 and to fill the cavity. Portions of coating layer 74 and further conductive material 76 remaining on the mask layer 44 other than within the cavity are removed by polishing or wet or dry etching. Later in the manufacturing process, when second dielectric layer 52 is etched through third mask layer 54, the sequence of depositing coating layer 74, depositing further conductive layer 76 and removing the coating and further conductive layers other than in the etched cavities is repeated, to unitarily form conductive lines 12a, 12b and vias 46.

The sequence of depositing coating layer 74, depositing conductive layer 76 and removing the coating and conductive layers other than in the etched cavity is also repeated for:

defining and unitarily forming vias 34 and conductive lines 14b of third layer 14 within layers 56, 60, through mask layers 58, 62; and defining and unitarily forming vias 39 and conductive lines 16b of fourth layer 16 within layers 56, 60, 66, 70, through mask layers 68, 72.

In this embodiment, vias 39 take the place of two stacked vias 34, 64 in previously described embodiments. As the series resistance of a via is substantially determined by the contact surface 36' material, the vias 39 have a resistance substantially equal to the resistance of vias 34—about 0.2 Ω, but spread over two via layers. This is equivalent to 0.1 Ω per via layer, for vias with a cross section of 0.4 µm×0.4 µm.

Figure 7A:
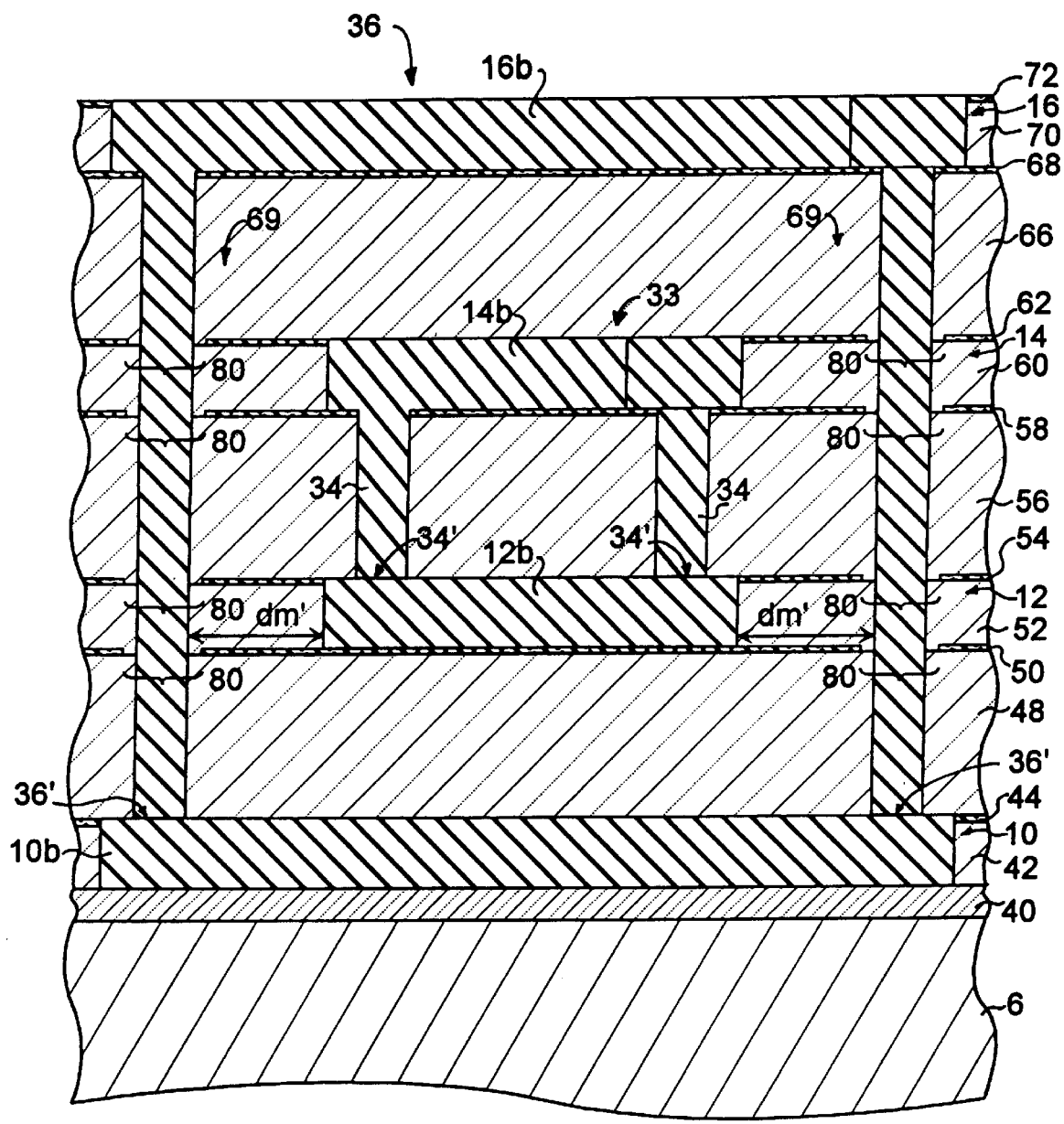

FIG. 7A shows a further embodiment of the invention. First conductive layer 10 is formed within the first dielectric layer 42 by any suitable process, such as the single damascene process described above. Vias are not, however, initially formed in first insulating layer 48. In locations where vias 69 are required to traverse first insulating layer 48, enlarged holes 80 are formed in the first mask layer 50. As the manufacturing process continues, the second conductive layer 12 is formed in the second dielectric layer, by a single damascene step, without etching of the first insulating layer. This may be achieved, for example, by selectively masking the enlarged holes 80 using a photosensitive resin. Vias 34 and third conductive layer 14, of the primary winding 33 are formed, according to either the single or dual damascene processes described above. Still, no via cavities are etched in first insulating layer 48. At each relevant step, enlarged holes 80 are copied into the third, fourth and fifth mask layers 54, 58, 62.

Third insulating layer 66 is deposited. Sixth masking layer 68 is deposited, and is patterned with the required locations of vias 69.

Fourth dielectric layer 70 is deposited, followed by seventh mask layer 72. Seventh mask layer 72 is then patterned with the required layout of fourth conductive layer 16. A single anisotropic etch, selective to the material of the dielectric layers, is applied to the structure. Cavities are cut in the required locations of vias 69. This etch continues for long enough to cut the cavities through layers 66, 60, 56, 52, 48. As may now be appreciated, due to the alignment errors inherent in such processes, the enlarged holes 80 are required to ensure that the cavities reach first conductive layer 10 with the same cross section as the patterns defined on mask layer 68. A conductive material is then deposited into the cavities etched, to unitarily form vias 69 and conductive lines 16b. This may be achieved by CVD, or a metal deposition by heated pulverization, or any other suitable process. The units composed of conductive line 16b and vias 69 are in direct electrical contact with the conductive line 10b of first layer 10.

Alternatively, the process described with reference to FIG. 6A may be used, whereby the pattern for the vias 69 is defined only in sixth dielectric layer 68, an anisotropic etch then being applied to etch through all dielectric, insulating and masking layers to reach first conductive layer 10. In such a process, sixth and seventh masking layers 68, 72 must either be of a different material from that of the other mask layers, and selectively etchable with respect to the material of the other mask layers; or must be thicker than the other mask layers if composed of the same material. The embodiment of FIG. 6A could alternatively be produced in a similar manner to that described with reference to FIG. 7A, by defining enlarged holes 80 on mask layers 58, 62 before etching cavities for vias 39.

Figure 7B:
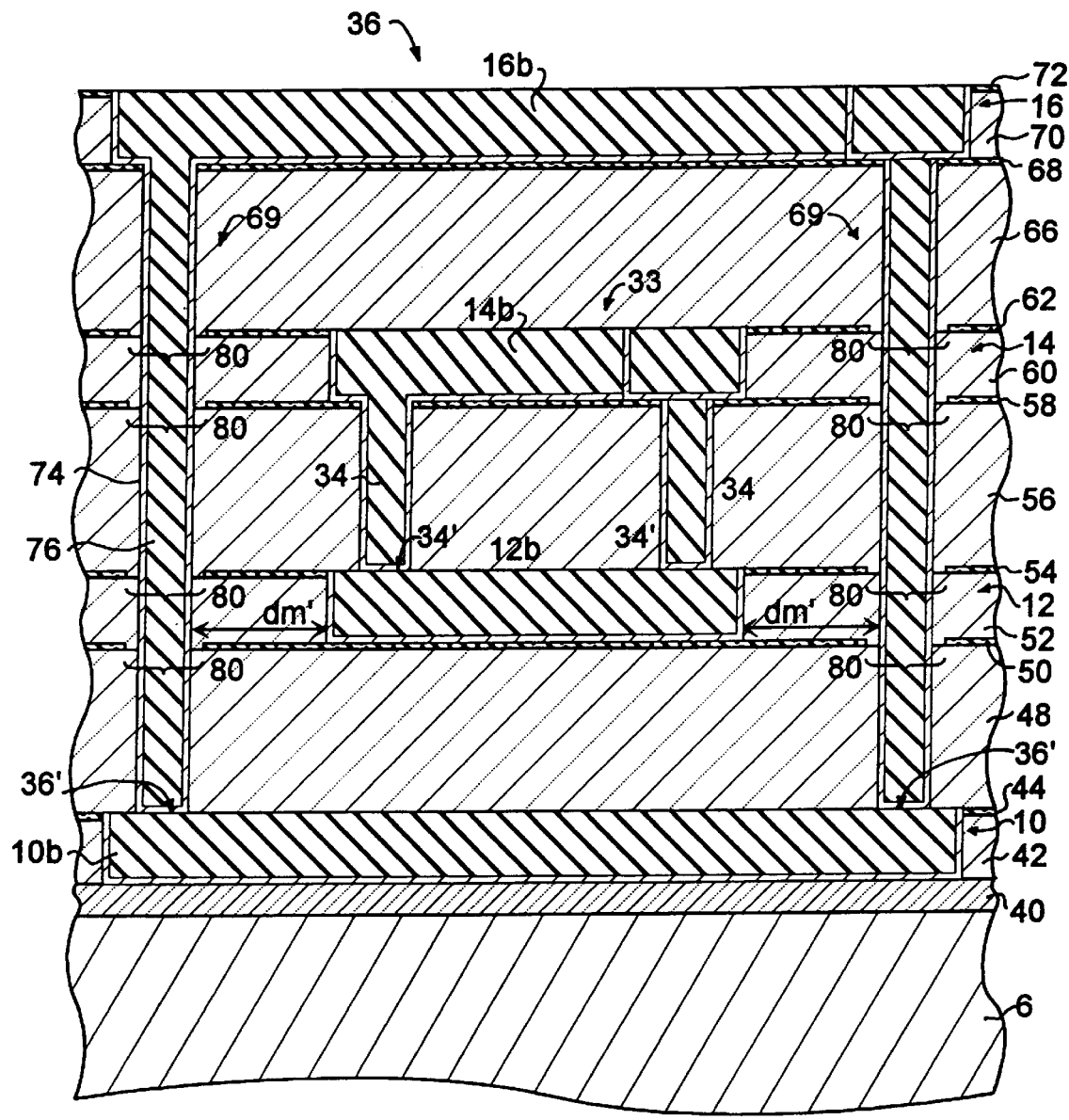

FIG. 7B shows a further embodiment of the invention. Similarly to the embodiment of FIG. 6B, a variant of the embodiment shown in FIG. 7A is represented. After etching through first dielectric layer 42 in the required motif for first conductive layer 10, a thin coating layer 74 is deposited inside the cavity. Following this deposition, a highly conductive material 76 is deposited, to cover the coating layer 74 and to fill the cavity. Portions of coating layer 74 and further conductive material 76 remaining on the mask layer 44 other than within the cavity are removed by polishing or wet or dry etching. Later in the manufacturing process, when layer 52 is etched through third mask layer 54, the sequence of depositing coating layer 74, depositing conductive layer 76 and removing the coating and conductive layers other than in the etched cavities is repeated.

The sequence of depositing coating layer 74, depositing conductive layer 76 and removing the coating and further conductive layers other than in the etched cavity is also repeated for:

defining vias 34 and third conductive layer 14 in layers 56, 60, through mask layers 58, 62; and defining vias 69 and fourth conductive layer 16 in layers 48, 52, 56, 60, 66, 70, through mask layers 68, 72 to unitarily form vias 69 with conductive line 16b. Each of the units comprising vias 69 and line 16b is in direct electrical contact with corresponding lines 10b of first layer 10.

This embodiment is particularly advantageous, as each turn of the secondary winding 36 comprises only two contact interfaces 36' for the equivalent of the six vias shown in FIGS. 4A, 4B. In addition, no metal pads 12a, 14a are required on second and third levels for vias connecting the fourth and first levels together. This is advantageous, as the structure of FIG. 7B may be more dense. In the embodiment of FIG. 4A, for example, a minimum allowable space dm between the features of second interconnect layer 12 defines the width of the secondary winding 36. The spacing dv between a mutualization of primary winding 33 of the second conductive layer 12 and a via 34 of secondary winding is rather greater than dm.

In the embodiment of FIG. 7B, a spacing dm' between a corresponding mutualization of primary winding and via 38 of secondary winding 36 may be approximately the minimum dimension dm. This leads to a greater packing density of the structure, an improved coupling coefficient, an improved factor of merit, and a reduced consumption of substrate surface area.

Typically, a transformer structure of the invention may be 6–7 $\mu$m wide and 5 $\mu$m high (this being defined by the layer thicknesses used in the manufacturing process employed for the manufacture of the structure), and of a length determined by the number of turns required on each of the primary and secondary windings.

The factor of merit of the transformer provided by the invention would be increased by the use of dielectric materials of low permittivity, the so-called "low-k dielectrics". Use of such materials for the dielectric and insulating layers would reduce the parasitic coupling capacitance between the windings 33, 36, and parasitic capacitance between turns of a same winding.

Although all of the above described embodiments use L-shaped lines in each conductive layer to construct the windings, a transformer according to the invention may be constructed using other suitable shapes. For example, consecutive vias may be connected together by substantially straight lines in a conductive layer, so that in plan view any one turn will be V-shaped.

Figure 8:
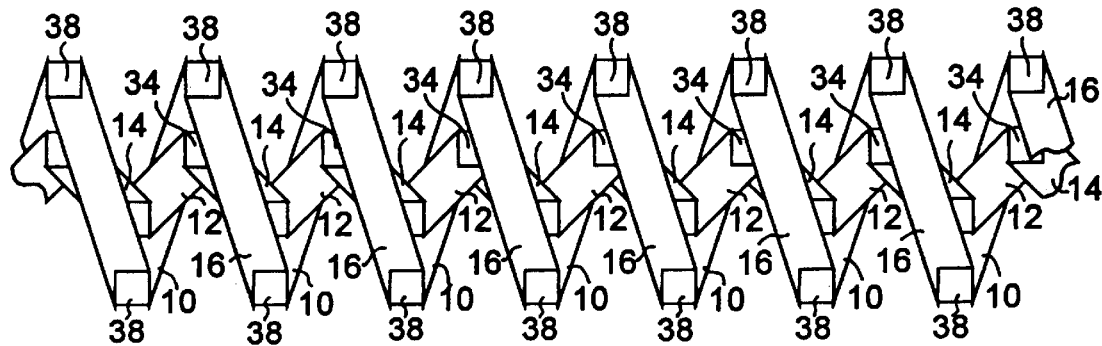
FIG. 8 shows a plan view of an embodiment of a transformer of the present invention.

FIG. 8 shows a plan view of such a possible arrangement, where consecutive vias in both windings are connected by substantially straight lines in the relevant conductive layer 10, 12, 14, 16. The coupling factor between the two windings of such a structure will be different from that of the earlier described embodiments.

The invention thus achieves its stated objects in that:

a transformer structure for use in an integrated circuit is provided, where the coupling between primary and secondary windings is high, due to the close proximity of the primary and secondary windings;

a transformer structure is provided which has an electromagnetic field substantially parallel to the upper surface of the substrate, thereby reducing the transmission of electromagnetic field into the substrate;

a transformer structure is provided which occupies a reduced surface area of the substrate, when compared to known transformers for integrated circuits;

a transformer structure is provided which is compatible with current integrated circuit manufacturing methods, and requires no special process steps, or special materials.

The use of a dual damascene process, or the formation of damascene vias through several levels in one step reduces the resistance of the windings sufficiently to form an efficient transformer using several conductive layers.

Although the invention has been described with the primary winding lying within a larger secondary winding, the functions of the two windings may be reversed, so that a secondary winding may be provided within a larger primary winding.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. In an integrated circuit comprising a substrate with a horizontal upper surface, a transformer characterized in that it comprises:

a first plurality of conductive lines arranged in a first layer on the upper surface of the substrate;

a second plurality of conductive lines arranged in a second layer, vertically separated from the first plurality of conductive lines by a first insulating layer;

a third plurality of conductive lines arranged in a third layer, vertically separated from the second plurality of conductive lines by a second insulating layer;

a fourth plurality of conductive lines arranged in a fourth layer, vertically separated from the third plurality of conductive lines by a third insulating layer;

first conductive vias extending through second insulating layer, connecting said second and third pluralities of conducting lines, whereby said second and third pluralities of conducting lines and said first conductive vias form a first winding; and second conductive vias extending through first, second and third insulating layers, connecting said first and fourth pluralities of conducting lines, whereby said first and fourth pluralities of conducting lines and said second conductive vias form a second winding, about and approximately concentric with said first winding.

2. A transformer according to claim 1 wherein the axes of said first and second windings are substantially parallel to the upper surface of the substrate.

3. A transformer according to claim 1 wherein each of the fourth plurality of conductive lines is unitarily composed with at least part of underlying second conductive vias.

4. A transformer according to claim 1 wherein each of the third plurality of conductive lines is unitarily composed with underlying first conductive vias, such units being in direct electrical contact with underlying respective ones of the second plurality of conductive lines.

5. A transformer according to claim 1 wherein the second conductive vias comprise pads in second and third layers, each pad being unitarily composed with an underlying part of respective second conductive vias.

6. A transformer according to claim 1 wherein each of the fourth plurality of conductive lines is unitarily composed with underlying second conductive vias, such units being in direct electrical contact with underlying respective ones of the first plurality of conductive lines.

7. A transformer according to claim 1 wherein the conductive lines and the conductive vias are substantially composed of copper.

8. A transformer according to claim 1 wherein the conductive lines and the conductive vias are substantially composed of aluminum.

9. A transformer according to claim 7 or claim 8, wherein the conductive lines and the conductive vias further comprise a coating layer of titanium nitride, encapsulating the conductive lines and the conductive vias on all surfaces other than their upper surfaces.

10. A transformer according to claim 1 wherein each turn of each winding includes only two contact surfaces.

11. A method for forming transformers in integrated circuits, characterized in that it comprises the steps of:
 a)—forming a first dielectric layer on an upper surface of a substrate;
 b)—patterning the first dielectric layer with a motif to form cavities corresponding to a desired arrangement of first conductive lines;
 c)—filling the cavities in the first dielectric layer to form a first plurality of conductive lines arranged in a first layer;
 d)—depositing a first insulating layer;
 e)—forming a second dielectric layer on the upper surface of the resulting structure;
 f)—patterning the second dielectric layer with a motif to form cavities corresponding to a desired arrangement of second conductive lines;
 g)—filling the cavities in the second dielectric layer to form a second plurality of conductive lines arranged in a second layer;
 h)—depositing a second insulating layer;
 i)—forming a third dielectric layer on the upper surface of the resulting structure;
 j)—patterning the third dielectric layer with a motif to form cavities corresponding to a desired arrangement of third conductive lines;
 k)—filling the cavities in the third dielectric layer to form a third plurality of conductive lines arranged in a third layer;
 l)—depositing a third insulating layer;
 m)—forming a fourth plurality of conductive lines arranged in a fourth layer;
 n)—between steps (h) and (l), performing the steps of:
  n1)—forming cavities in the second insulating layer according to a motif corresponding to required locations of first conductive vias;
  n2)—filling the cavities in the second insulating layer with conductive material to form first conductive vias extending through second insulating layer, to electrically connect respective ones of second and third pluralities of conducting lines, to form a first winding; and
 p)—between steps (d) and (m), performing the steps of:
  p1)—forming cavities in the first, second and third insulating layers according to a motif corresponding to required locations of second conductive vias;
  p2)—filling the cavities in the first, second, and third insulating layers with conductive material to form first conductive vias extending through first, second and third second insulating layers,
 to electrically connect respective ones of first and fourth pluralities of conducting lines, so as to form a second winding about and approximately concentric with said first winding.

12. A method according to claim 11 wherein the step (m) comprises the steps of:
 m1)—forming a fourth dielectric layer on an upper surface of a substrate;
 m2)—patterning the fourth dielectric layer with a motif to form cavities corresponding to a desired arrangement of fourth conductive lines;
 m3)—filling the cavities in the fourth dielectric layer to form the fourth plurality of conductive lines.

13. A method according to claim 11 wherein, in step (p1), the cavities are formed in first, second and third insulating layers in a single step.

14. A method according to claim 11 wherein, in step (p2), the filling of the cavities in first, second and third insulating layers is performed in a single step.

15. A method according to claim 11 wherein, in step (p2), the filling of the cavities in first, second and third insulating layers is performed within step (m3).

16. A method according to claim 11 wherein, in step (p1), the cavities are formed in second and third insulating layers in a single step.

17. A method according to claim 11 wherein, in step (p2), the filling of the cavities in second and third insulating layers is performed in a single step.

18. A method according to claim 17 wherein, in step (p2), the filling of the holes in second and third insulating layers is performed within step (m3).

* * * * *